United States Patent
Tralshawala et al.

(10) Patent No.: US 7,830,140 B2
(45) Date of Patent: Nov. 9, 2010

(54) EDDY CURRENT SYSTEM AND METHOD FOR ESTIMATING MATERIAL PROPERTIES OF PARTS

(75) Inventors: Nilesh Tralshawala, Rexford, NY (US); Yuri Alexeyevich Plotnikov, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 664 days.

(21) Appl. No.: 11/834,759

(22) Filed: Aug. 7, 2007

(65) Prior Publication Data

US 2009/0039877 A1   Feb. 12, 2009

(51) Int. Cl.
  *G01R 33/14* (2006.01)
  *G01R 35/00* (2006.01)
  *G01N 27/72* (2006.01)
(52) U.S. Cl. .................. 324/222; 324/202; 324/228
(58) Field of Classification Search .......... 324/202, 324/222–225, 228–234, 238–240
See application file for complete search history.

(56) References Cited

U.S. PATENT DOCUMENTS

| | | | |
|---|---|---|---|
| 4,727,322 A * | 2/1988 | Lonchampt et al. ......... | 324/229 |
| 5,659,248 A | 8/1997 | Hedengren et al. | |
| 6,657,429 B1 | 12/2003 | Goldfine et al. | |
| 6,670,808 B2 | 12/2003 | Nath et al. | |
| 2004/0066188 A1 | 4/2004 | Goldfine et al. | |
| 2006/0009865 A1 | 1/2006 | Goldfine et al. | |
| 2006/0244443 A1 | 11/2006 | Goldfine et al. | |

OTHER PUBLICATIONS

C. V. Dodd & W. E. Deeds: "Analytical Solutions to Eddy-Current Probe-Coil Problems"; Journal of Applied Physics, vol. 39, No. 6; May 1968; pp. 2829-2838.

* cited by examiner

*Primary Examiner*—Bot L LeDynh
(74) *Attorney, Agent, or Firm*—Penny A. Clarke

(57) ABSTRACT

A method of inspecting a test part is provided. The method includes positioning an eddy current probe on a surface of the test part and scanning the test part using the eddy current probe to generate a first signal corresponding to a no lift-off condition of the test part. The method further includes positioning the eddy current probe at a pre-determined distance from the surface of the test part and scanning the test part using the eddy current probe positioned at the pre-determined distance from the test part to generate a second signal corresponding to a lift-off condition of the test part. The method also includes processing the first and second signals to estimate an electrical conductivity of the test part.

24 Claims, 6 Drawing Sheets

EDDY CURRENT SYSTEM AND METHOD FOR ESTIMATING MATERIAL PROPERTIES OF PARTS

BACKGROUND

The invention relates generally to systems and methods for estimating material properties of a part and, more particularly to, an eddy current system and method for estimating material properties of a shotpeened part.

Components such as aircraft engine parts are protected from developing microcracks by creating a compressively stressed surface layer using shotpeening. Very briefly, shotpeening involves bombarding the surface of the part with small spherical media called shot. Each piece of shot striking the surface imparts a small indentation to the part. In order for the indentation to be created, the surface of the part must be yielded in tension. Further, below the surface, the material tries to restore its original shape, thereby producing a hemisphere of material that is highly stressed in compression. Monitoring of material properties of shotpeened parts is desirable to determine how long the part can be used before it needs to be re-shotpeened. For example, it is desirable to monitor the shotpeen residual stress depth profile of the part to assess the need for re-shotpeening of the part.

Typically, a destructive evaluation of the shotpeened part is performed to estimate the material properties of the part. However, this technique makes the part unusable and therefore requires the part to be replaced. In other applications, certain shotpeened parts may be re-shotpeened at select time intervals without assessing the need for re-shotpeening the part.

Eddy current measurement techniques may be employed to non-destructively measure the material properties of the shotpeened part. Eddy current measurement technique is based on the principle of electromagnetic induction. In one method, a drive coil is employed to induce eddy currents within the material under inspection, and secondary magnetic fields resulting from the eddy currents are detected by a sense coil, generating signals, which are subsequently processed for estimating the material properties of the part. In another method, eddy currents induced in the material under inspection produce changes in the self-impedance of a coil and by monitoring these changes one can estimate material properties of the part. However, existing eddy current measurement techniques do not account for error introduced due to surface roughness associated with the shotpeening and therefore do not provide an accurate estimation of the material properties of the part.

Accordingly, it would be desirable to develop estimation techniques that provide accurate estimation of material properties of a part. Particularly, it will be advantageous to develop a technique for accurate estimation of the material properties of a shotpeened part without damaging the part.

BRIEF DESCRIPTION

Briefly, according to one embodiment of the invention, a method of inspecting a test part is provided. The method includes positioning an eddy current probe on a surface of the test part and scanning the test part using the eddy current probe to generate a first signal corresponding to a no lift-off condition of the test part. The method further includes positioning the eddy current probe at a pre-determined distance from the surface of the test part and scanning the test part using the eddy current probe positioned at the pre-determined distance from the test part to generate a second signal corresponding to a lift-off condition of the test part. The method also includes processing the first and second signals to estimate an electrical conductivity of the test part.

In another embodiment, an eddy current system for inspecting a test part is provided. The eddy current system includes an eddy current probe configured to scan the test part and generate first and second signals corresponding to no lift off and lift-off conditions of the test part and a processor configured to process the first and second signals to estimate an electrical conductivity of the test part.

In another embodiment, a method of estimating a material property of a shotpeened test part is provided. The method includes scanning the test part using an eddy current probe for a no lift-off condition to generate a first signal and introducing a lift-off condition for the test part. The method also includes scanning the test part using the eddy current probe for the lift-off condition to generate a second signal and processing the first and second signals to estimate the material property of the test part.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
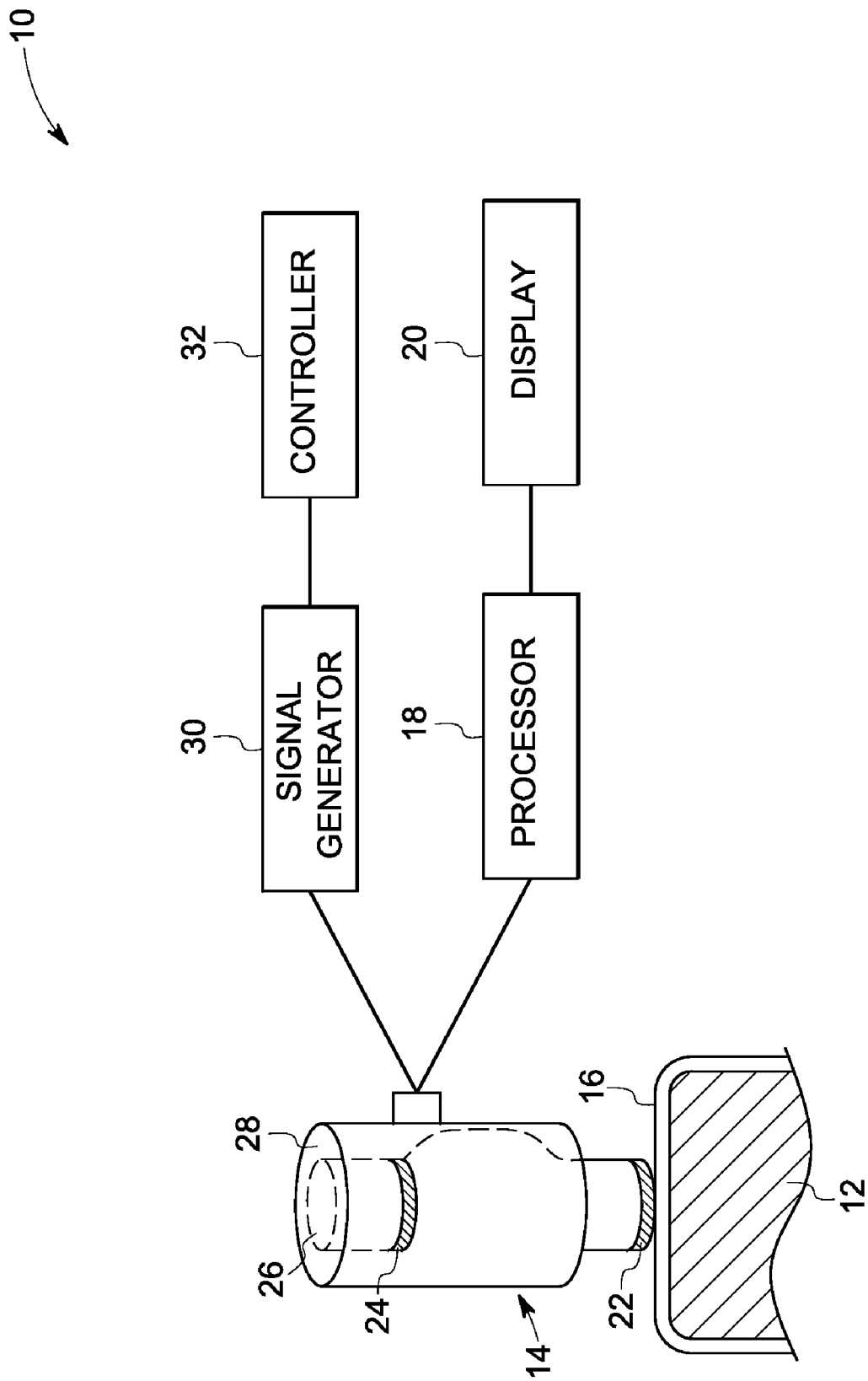
FIG. 1 is a diagrammatical representation of an eddy current system for estimating material properties of a test part.

As discussed in detail below, embodiments of the present invention function to provide an inspection technique that provides an estimation of material properties of a part. In particular, the present invention facilitates accurate estimation of material properties of a shotpeened part using an eddy current system. FIG. 1 is a diagrammatical representation of an eddy current system 10 for estimating material properties of a test part 12. The eddy current system 10 includes an eddy current probe 14 configured to scan the test part 12 and generate first and second signals corresponding to no lift-off and lift-off conditions of the test part 12. As used herein, the term "lift-off" represents an offset introduced between the eddy current probe 14 and a surface 16 of the test part 12. In this exemplary embodiment, the test part 12 comprises a shotpeened part having an apparent lift-off due to its surface roughness. The technique described herein facilitates substantially eliminating error introduced in conductivity estimation of the test part due to such apparent lift-off. In one exemplary embodiment, the eddy current probe 14 comprises a driver-receiver probe. Alternately, the eddy current probe 14 comprises a self-impedance probe.

The eddy current system 10 includes a processor 18 that is configured to process the first and second signals corresponding to the no lift-off and lift-off conditions of the test part 12 to estimate an electrical conductivity of the test part 12. It should be noted that the present invention is not limited to any particular processor for performing the processing tasks of the invention. The term "processor," as that term is used herein, is intended to denote any machine capable of performing the calculations, or computations, necessary to perform the tasks of the invention. The term "processor" is intended to denote any machine that is capable of accepting a structured input and of processing the input in accordance with prescribed rules to produce an output. It should also be noted that the phrase "configured to" as used herein means that the processor is equipped with a combination of hardware and software for performing the tasks of the invention, as will be understood by those skilled in the art Further, the eddy current system 10 may include a display 20 for displaying material properties such as the estimated electrical conductivity of the test part 12 to a user of the system. In the illustrated embodiment, the eddy current probe 14 includes a test eddy current coil 22 facing the test part 12 to generate test signals corresponding to the test part 12. Additionally, the eddy current probe 14 includes a reference eddy current coil 24 facing a reference sample 26 to generate reference signals corresponding to the reference sample 26. In this embodiment, the test eddy current coil 22 and the reference eddy current coil 24 along with the reference sample 26 are disposed within a housing 28. In certain exemplary embodiments, the test and reference eddy current coils comprise single eddy current array probes (SECAPs), or eddy current array probes (ECAPs), or combinations thereof.

Further, the processor 18 is configured to compare the test and reference signals from the test and the reference eddy current coils 22 and 24 for generating the first and second signals. Beneficially, the comparison between the test and reference signals facilitates reduction of effects of ambient conditions thereby increasing the accuracy of the eddy current probe 14. In the illustrated embodiment, a signal generator 30 is employed to energize the test and the reference eddy current coils 22 and 24 at a plurality of frequencies. Further, a controller 32 may be employed to control the signal generator 30. The signal generator 30 preferably supplies an AC signal to the test and reference eddy current coils 22 and 24, causing the test and reference eddy current coils 22 and 24 to emit a test and a reference magnetic field respectively. The test and reference magnetic fields induce test and reference eddy currents in the test part 12 and the reference sample 26, respectively. In one exemplary embodiment, the signal generator is configured to energize the test and reference eddy current coils 22 and 24 at frequencies in a range of about 100 kHz to about 100 MHz.

The processor 18 is configured to estimate materials properties such as electrical conductivity of the test part 12 using the first and second signals from the eddy current probe 14 and by using data from calibration standards. In particular, the present technique involves estimation of the electrical conductivity of the test part 12 by substantially reducing any error introduced by an apparent lift-off introduced by surface roughness associated with the shotpeening of the test part 12. The details of the estimation of the material properties of the test part 12 will be described in detail below with reference to FIGS. 3-5.

Figure 2:
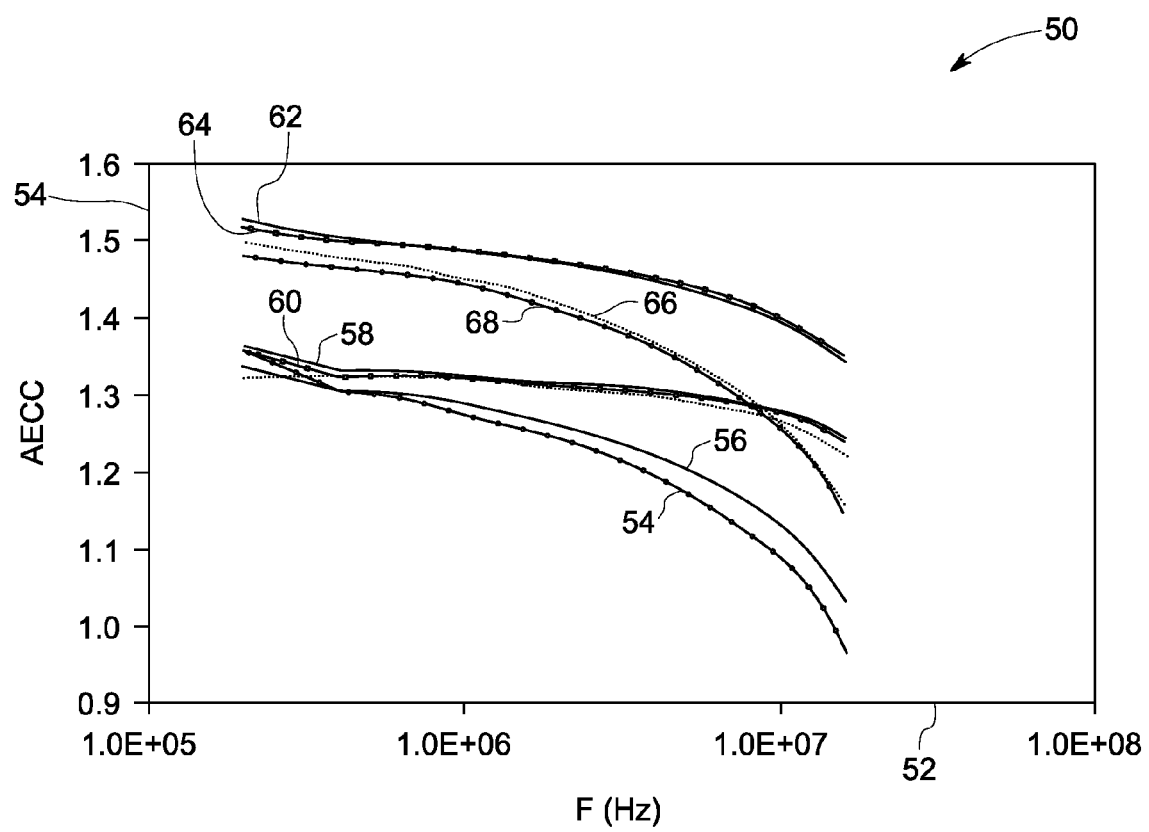
FIG. 2 is a graphical representation of exemplary results for conductivity profiles of the test part of FIG. 1 without error correction due to surface roughness of the test part.

FIG. 2 is a graphical representation of exemplary results 50 for conductivity profiles of the test part 12 of FIG. 1 obtained without error correction due to surface roughness of the test part 12. The abscissa axis 52 represents energizing frequencies of the eddy current probe 14 (see FIG. 1) and the ordinate axis 54 represents an apparent eddy current conductivity (AECC) of the test part. In this example, the conductivity profiles 50 represent the electrical conductivity of variously aged Inconel (INCO) 718 shotpeened test part 12. For example, profiles 54, 56, 58 and 60 represent conductivity profiles for parts shotpeened at a temperature of about 1000° F. for about 250 hrs at different shotpeening intensities. Similarly, profiles 62, 64, 66 and 68 represent conductivity profiles for parts shotpeened at a temperature of about 1200° F. for about 500 hrs at different shotpeening intensities. As can be seen, the measured apparent electrical conductivity 54 reduces with an increase in the frequency 52. It should be noted that, the reduction in the conductivity 54 is due to an apparent lift-off introduced by surface roughness of the shotpeened test part 12. The error introduced due to the apparent additional lift-off introduced by the surface roughness can be substantially reduced by using an inspection technique that will be described below with reference to FIGS. 3-5.

Figure 3:
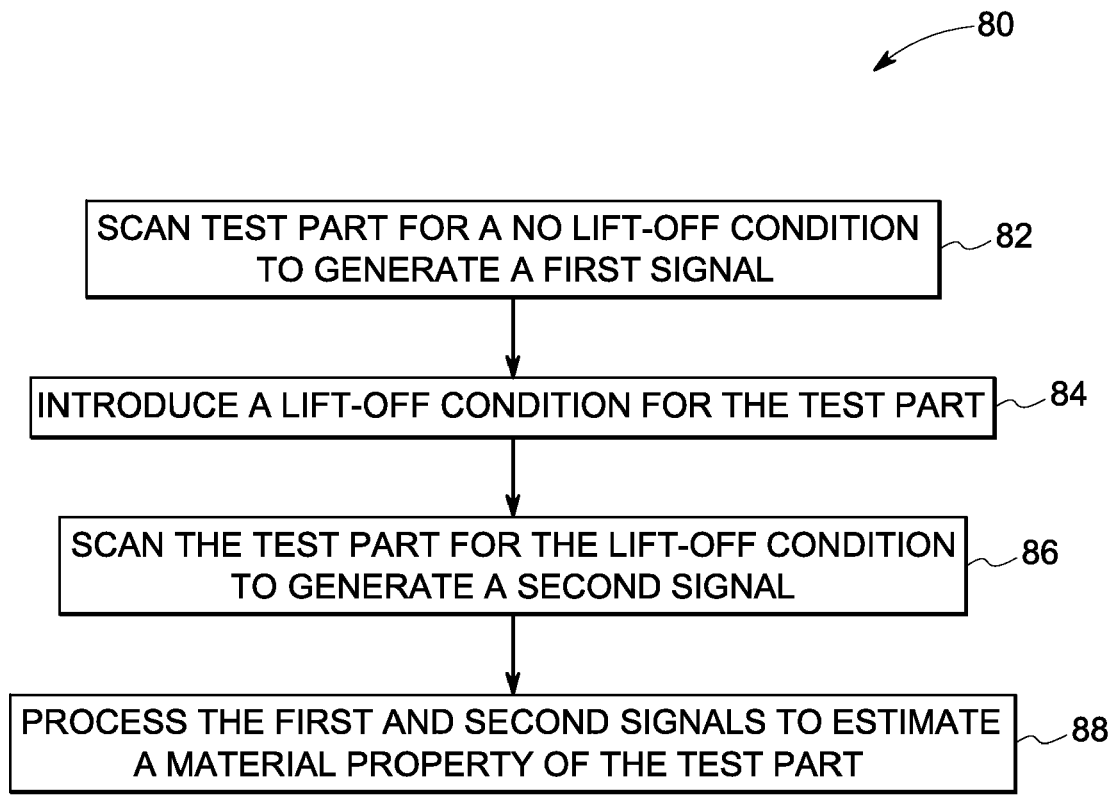
FIG. 3 is a flow chart illustrating an exemplary eddy current inspection method.

FIG. 3 is a flow chart illustrating an exemplary eddy current inspection method 80. At step 82, a test part is scanned using an eddy current probe for a no lift-off condition to generate a first signal. Further, a lift-off condition is introduced for the test part (step 84). In one exemplary embodiment, the lift-off condition is introduced by positioning the eddy current probe at a pre-determined distance from the test part. For example, a layer of an electrically non-conductive material may be disposed between the eddy current probe and the test part for introducing the lift-off condition. Non-limiting examples of the electrically non-conductive material include plastic materials such as materials marketed under the tradenames Teflon® or Kapton®. In one non-limiting example, a layer of Teflon® with a thickness between about 25 microns and about 500 microns is used to introduce the lift-off condition. At step 86, the test part is scanned using the eddy current probe for the introduced lift-off condition to generate a second signal. Further, the first and signals corresponding to the no lift-off and lift-off conditions of the test part are processed to estimate a material property of the test part (step 88). Examples of the material property of the test part include, but are not limited to, electrical conductivity of the test part, residual stress of the test part and combinations thereof. In this exemplary embodiment, a lift-off curve is generated using the first and second signals. Further, a lift-off angle is estimated from the lift-off curve using an eddy current virtual air point technique that will be described below.

Figure 4:
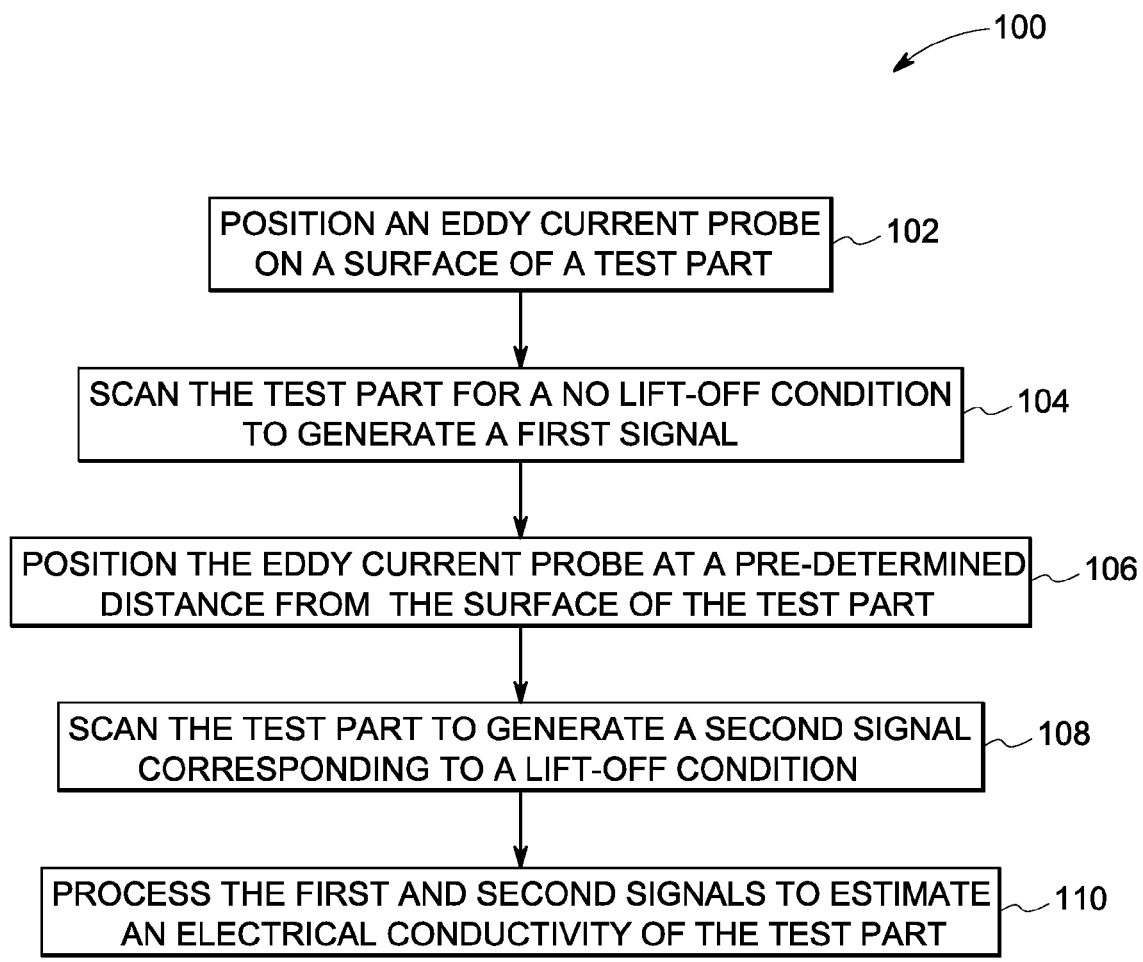
FIG. 4 is a flow chart illustrating another exemplary eddy current inspection method.

FIG. 4 is a flow chart illustrating another exemplary eddy current inspection method 100. At step 102, an eddy current probe is positioned on a surface of a test part. Examples of the eddy current probes include single eddy current array probes (SECAPs), or eddy current array probes (ECAPs). Further, the test part is scanned using the eddy current probe to generate a first signal corresponding to a no lift-off condition of the test part (step 104). At step 106, the eddy current probe is positioned at a pre-determined distance from the surface of the test part. For example, a layer of an electrically non-conductive material may be disposed between the eddy current probe and the test part. In one example, a plastic material such as that marked under the tradename Teflon® is disposed between the eddy current probe and the test part. In this particular example, a thickness of the layer of plastic material is between about 25 microns to about 500 microns.

Further, the test part is scanned using the eddy current probe positioned at the pre-determined distance to generate a second signal corresponding to a lift-off condition of the test part (step 108). At step 110, the first and second signals are processed to estimate an electrical conductivity of the test part. The first and second signals corresponding to the no lift-off and lift-off conditions are utilized to generate a lift-off curve. Moreover, a lift-off angle is estimated from the lift-off curve using an eddy current virtual air point (VAP) technique that will be described below with reference to FIG. 5.

In one exemplary embodiment, the scanning step includes energizing a test eddy current coil facing the test part to generate a plurality of test signals. Further, the scanning step includes energizing a reference eddy current coil facing a reference sample to generate a plurality of reference signals. The test and the reference signals are compared to generate the first and second signals for estimating the electrical conductivity of the test part. As discussed above, the comparison between the test and reference signals facilitates reduction of effects of ambient conditions thereby increasing the accuracy of the eddy current probe.

In certain embodiments, the test part is scanned at a plurality of frequencies to obtain the first and second signals corresponding to the no lift-off and lift-off conditions of the part at each of the plurality of frequencies. Further, an electrical conductivity profile may be obtained using the first and second signals obtained at the plurality of frequencies. Additionally, a residual stress profile for the test part may be generated using the electrical conductivity depth profile. In one exemplary embodiment, the residual stress profile for the part is generated by relating the conductivity depth profile to a plurality of residual stress profile data obtained by x-ray diffraction (XRD) testing. Advantageously, the conductivity depth profile and the residual stress profile may be utilized to assess the need for replacing or re-shotpeening the test part.

Figure 5:
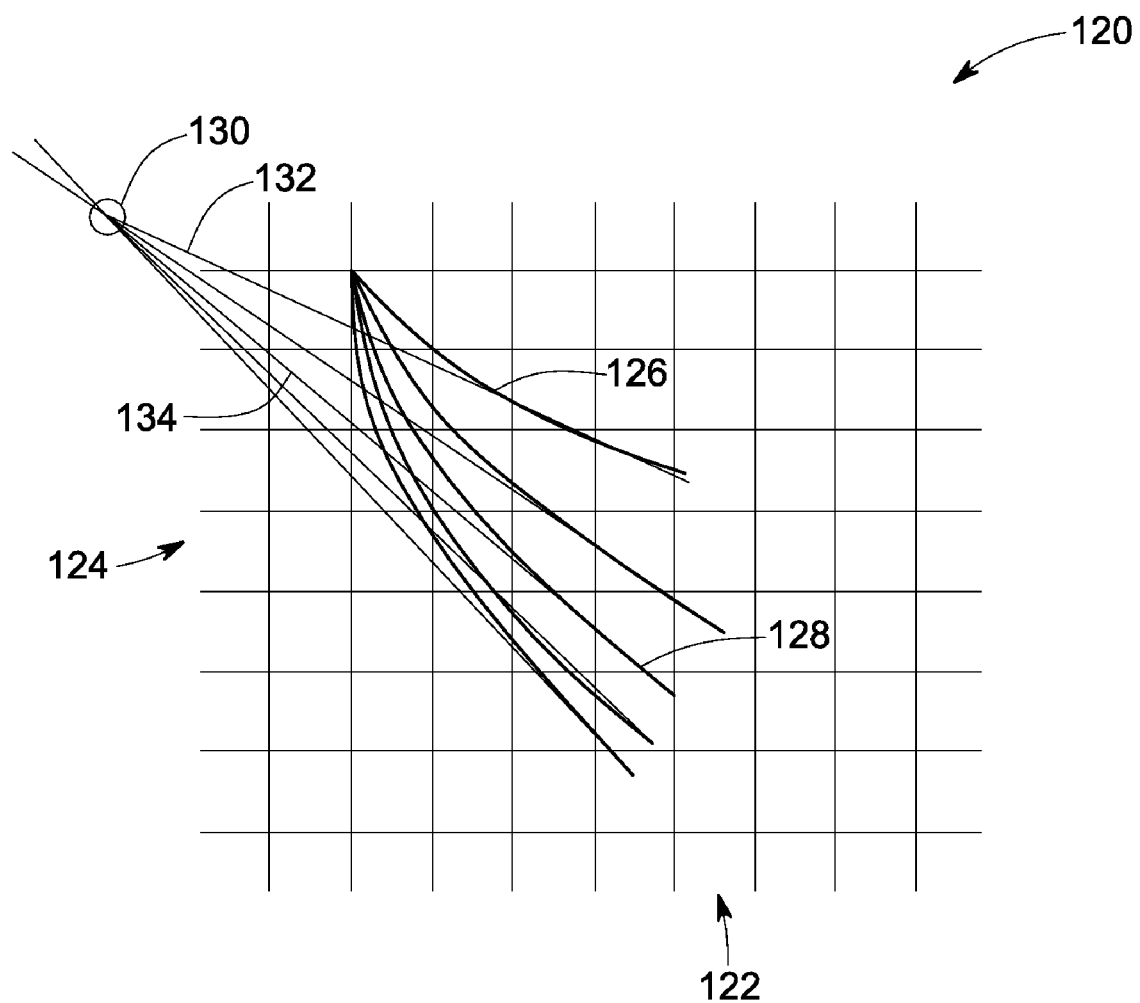
FIG. 5 is a graphical representation of exemplary results for conductivity profiles of the test part of FIG. 1 for estimation of a lift-off angle.

FIG. 5 is a graphical representation of exemplary results 120 for conductivity profiles of a test part 12 for estimation of a lift-off angle. The abscissa axis represents a resistive component 122 and the ordinate axis represents a reactive component 124 for the measured impedance using the eddy current probe. As described above, the measurements for the no lift-off and lift-off conditions of the test part are obtained, and the slope of the line joining these two data points is indicative of the apparent eddy current conductivity (AECC) at that respective frequency. In this exemplary embodiment, lift-off profiles for different test parts are represented by reference numerals such as 126 and 128. The lift-off profiles such as 126 and 128 are generated by successively lifting the eddy current probe 14 (see FIG. 1) away from the surface of the test part 12. As a result, the probe 14 moved from bottom right end of the curve (no lift-off condition) to the origin of the co-ordinate system where the probe 14 is substantially away from the test part 12. In this embodiment, the straight lines indicating initial slopes of these curves 126 and 128, such as represented by reference numerals line 132 and 134 indicate slope of lift-off curves 126 and 128 respectively. The lines such as 132 and 134 meet at a point indicated by reference numeral 130. This point is called a virtual air point (VAP). Further, the slopes of the straight lines 132 and 134 uniquely identify conductivity of the test part 12 and are substantially independent of surface roughness introduced due to shotpeening of the test part.

In this embodiment, the lift-off angle is represented by the following equation:

$$\theta = \frac{180}{\pi} \tan^{-1}\left[\frac{X_1 - X_0}{R_1 - R_0}\right] \quad (1)$$

where

θ is the lift-off angle;

$X_1$ is the reactive component of the test part corresponding to a lift-off of l;

$X_0$ is the reactive component of the test part corresponding to a no lift-off condition;

$R_1$ is the resistive component of the test part having a lift-off of l; and $R_0$ is the resistive component of the test part corresponding to the no lift-off condition.

In certain embodiments, data are obtained on two reference calibration samples, one having an electrical conductivity slightly higher than an expected electrical conductivity of the test part 12 and another having an electrical conductivity slightly lower than the expected conductivity of the test part 12. In one embodiment, the conductivities of the two reference calibration standards and the test part 12 are very close to each other. In this exemplary embodiment, the electrical conductivity (σ) of the test part may be represented by the following equation:

$$\sigma = m\theta + c \quad (2)$$

where θ is estimated using Equation (1) above, and m and c are determined using the two reference standards.

Figure 6:
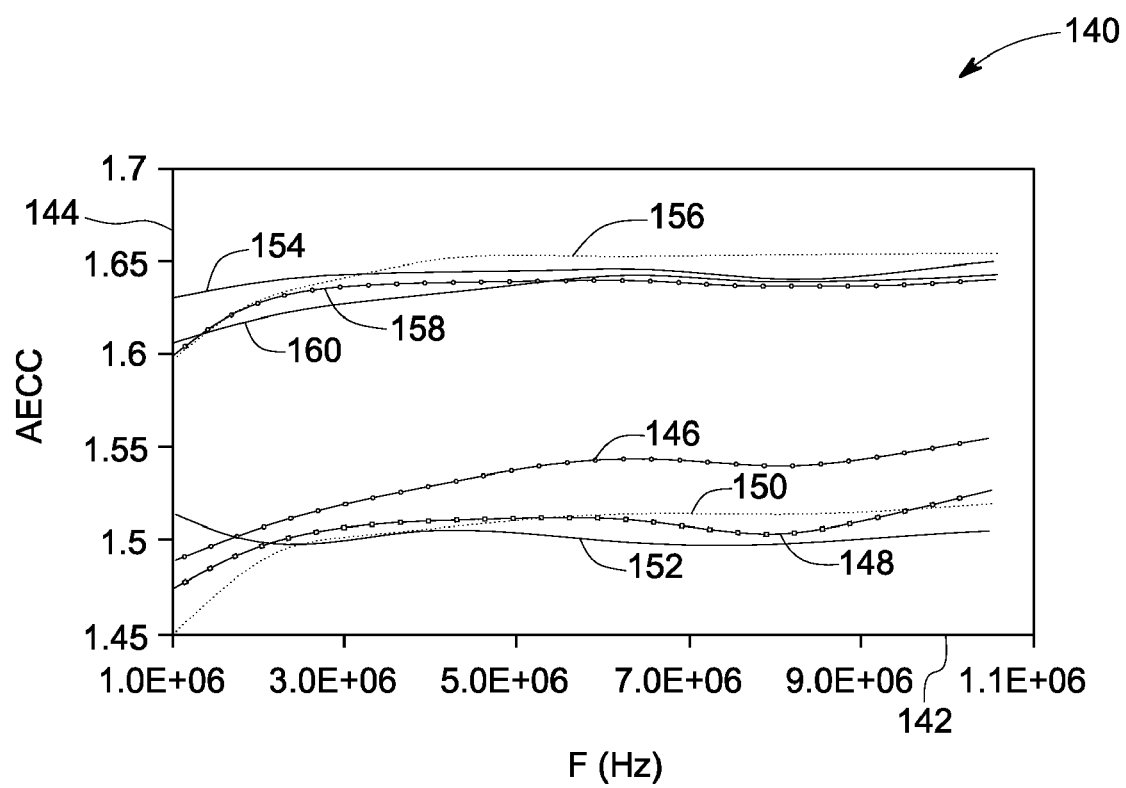
FIG. 6 is a graphical representation of exemplary results for conductivity profiles of the test part of FIG. 1 with error correction due to surface roughness of the test part.

These measurements can then be carried out at different frequencies resulting in a conductivity vs. frequency profile such as illustrated in FIG. 6. In one exemplary embodiment, the eddy current probe is calibrated using measurements from the test part and from a reference part having a known electrical conductivity. In this embodiment, a Dodd-Deeds technique may be employed to estimate the electrical conductivity of the test part using the measurements from the test and reference parts. The electrical conductivity of the test part is estimated using measurements obtained at first and second frequencies from the test and reference parts. In one embodiment, the reference part comprises an annealed sample of the test part. Further, in certain embodiments, the first and second frequencies are substantially equal to each other. In one embodiment, the first and second frequencies are 100 k Hz and 110 kHz respectively. In another embodiment, the first and second frequencies are 10 MHz and 11 MHz respectively. The absolute value of the conductivity of the test part is estimated as per the following equation:

$$\sigma_w = \sigma_0 \left(1 + \frac{\omega_0 - \omega_1}{\omega_0} \frac{|V(\sigma_0, \omega_0) - V(\sigma_w, \omega_0)|}{|V(\sigma_w, \omega_0) - V(\sigma_w, \omega_1)|}\right)^{-1} \quad (3)$$

where $V(\sigma_0, \omega_0)$ is the sensor signal corresponding to the reference part;

$V(\sigma_w, \omega_0)$ is the sensor signal corresponding to the test part at a first frequency $\omega_0$;

$V(\sigma_w, \omega_1)$ is the sensor signal corresponding to the test part at a second frequency $\omega_1$;

$\sigma_0$ is the known electrical conductivity of the reference part; and $\sigma_w$ is the unknown electrical conductivity of the test part.

Thus, by having eddy current measurements from the reference part and the test part at a plurality of frequencies, an accurate estimation of the electrical conductivity of the test part is obtained.

Advantageously, because of the lift-off curves and their slopes (represented by θ in Equation 1) that are used in this technique, the lift-off angles are independent of any apparent lift-off created between the probe and the test part due to surface roughness of the part. Thus, the technique described above facilitates estimation of the electrical conductivity of the test part that is substantially independent of any lift-off introduced due to surface roughness of a shotpeened part.

FIG. 6 is a graphical representation of exemplary results 140 for conductivity profiles of the test part 12 of FIG. 1 with error correction due to surface roughness of the test part 12. The abscissa axis 142 represents a frequency measured in Hz, and the ordinate axis 144 represents the AECC for an INCO 718 test part. In this example, profiles such as represented by reference numerals 146, 148, 150 and 152 represent conductivity profiles for unaged INCO 718 test parts. Additionally, the profiles such as represented by reference numerals 154, 156, 158 and 160 represent conductivity profiles for INCO 718 samples aged at about 1200° F. for about 500 hrs at different shotpeening intensities. As can be seen, as the frequency increases, the unaged samples show a monotonic increase in the electrical conductivity. Further, the electrical conductivity of the aged samples initially increases with the frequency at lower frequencies but is substantially constant beyond a frequency of about 3 MHz due to relaxation of surface residual stress due to annealing effects of heat treatment.

The various aspects of the methods and systems described herein above have utility in different applications, such as in the aerospace industry. The methods and systems described above allow estimation of material properties of parts using an eddy current inspection system. In particular, the methods and systems utilize an estimation technique that provides accurate estimation of material properties such as electrical conductivity of a shotpeened part. These then are related to the residual stress to obtain residual stress depth profile of the shotpeened part. Accordingly, parts that need to be re-shotpeened or replaced can be detected more reliably. In some cases, these results would indicate that the residual stress is better than expected and parts can be left in service longer or in some circumstances these methods would indicate an early relaxation of stress and the parts can be replaced before any damage or failure might occur. This can then result in timely replacement of critical engine component and parts and in some cases even prolong life of parts. Moreover, since these methods and systems employ nondestructive inspection techniques, the costs for conducting the inspection are also reduced thereby allowing all parts to be tested instead of testing just a few representative parts by traditional destructive methods that cannot be used in future.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of inspecting a test part, comprising:
   positioning an eddy current probe on a surface of the test part;
   scanning the test part using the eddy current probe to generate a first signal corresponding to a no lift-off condition of the test part;
   positioning the eddy current probe at a pre-determined distance from the surface of the test part;
   scanning the test part using the eddy current probe positioned at the pre-determined distance from the test part to generate a second signal corresponding to a lift-off condition of the test part;
   processing the first and second signals to estimate an electrical conductivity of the test part;
   scanning the part using the eddy current probe at a plurality of frequencies to obtain first and second signals corresponding to the no lift-off and lift-off conditions of the part at each of the plurality of frequencies; and
   obtaining a conductivity depth profile using the first and second signals obtained at the plurality of frequencies.

2. The method of claim 1, wherein positioning the eddy current probe at the pre-determined distance comprises disposing a layer of an electrically non-conductive material between the eddy current probe and the test part.

3. A method of inspecting a test part, comprising:
   positioning an eddy current probe on a surface of the test part;
   scanning the test part using the eddy current probe to generate a first signal corresponding to a no lift-off condition of the test part;
   positioning the eddy current probe at a pre-determined distance from the surface of the test part;
   scanning the test part using the eddy current probe positioned at the pre-determined distance from the test part to generate a second signal corresponding to a lift-off condition of the test part; and
   processing the first and second signals to estimate an electrical conductivity of the test part, wherein the processing step comprises:
   generating a lift-off curve using the first and second signals corresponding to the no lift-off and lift-off conditions of the test part;
   estimating a lift-off angle from the first and second signals corresponding to the no lift-off and lift-off conditions of the test part, wherein the lift-off angle ($\theta$) is represented by $$\theta = \frac{180}{\pi} \tan^{-1}\left[\frac{X_1 - X_0}{R_1 - R_0}\right]$$

where
   $X_1$ is the reactive component of the test part corresponding to a lift-off of $l$;
   $X_0$ is the reactive component of the test part corresponding to a no lift-off condition;
   $R_1$ is the resistive component of the test part having a lift-off of $l$; and
   $R_0$ is the resistive component of the test part corresponding to the no lift-off condition; and
   estimating the electrical conductivity of the test part, wherein the electrical conductivity is represented by
   $\sigma = m\theta + c$
where m and c are determined using two reference standards.

4. The method of claim 3, further comprising calibrating the eddy current probe using measurements from the test part and from a reference part having a known electrical conductivity.

5. The method of claim 4, wherein the calibrating step comprises measuring impedance of the test part at first and second frequencies and estimating the electrical conductivity of the test part based upon the measured impedances.

6. The method of claim 1, further comprising generating a residual stress profile for the test part from the conductive depth profile.

7. The method of claim 6, wherein generating the residual stress profile for the test part comprises relating the conductive depth profile for the test part to a plurality of residual stress profile data obtained by x-ray diffraction testing.

8. A method of inspecting a test part, comprising:
   positioning an eddy current probe on a surface of the test part;

scanning the test part using the eddy current probe to generate a first signal corresponding to a no lift-off condition of the test part;

positioning the eddy current probe at a pre-determined distance from the surface of the test part;

scanning the test part using the eddy current probe positioned at the pre-determined distance from the test part to generate a second signal corresponding to a lift-off condition of the test part; and processing the first and second signals to estimate an electrical conductivity of the test part, wherein the test part comprises a shotpeened part and the lift-off condition corresponds to a lift-off introduced by surface roughness of the shotpeened part such that the estimated electrical conductivity of the shotpeened part is independent of the surface roughness of the shotpeened part.

9. A method of inspecting a test part, comprising:

positioning an eddy current probe on a surface of the test part;

scanning the test part using the eddy current probe to generate a first signal corresponding to a no lift-off condition of the test part;

positioning the eddy current probe at a pre-determined distance from the surface of the test part;

scanning the test part using the eddy current probe positioned at the pre-determined distance from the test part to generate a second signal corresponding to a lift-off condition of the test part; and processing the first and second signals to estimate an electrical conductivity of the test part, wherein the scanning step comprises:

energizing a test eddy current coil facing the test part to generate a plurality of test signals corresponding to the no lift-off and lift-off conditions of the test part;

energizing a reference eddy current coil facing a reference sample to generate a plurality of reference signals corresponding to the no lift-off and lift-off conditions of the reference sample; and comparing the test and reference signals at no lift-off and lift-off conditions to generate the first and second signals for estimating the conductivity of the test part.

10. An eddy current system for inspecting a test part, comprising:

an eddy current probe configured to scan the test part and generate first and second signals corresponding to no lift off and lift-off conditions of the test part; and a processor configured to process the first and second signals to estimate an electrical conductivity of the test part, wherein the eddy current probe comprises:

a test eddy current coil facing the test part to generate test signals corresponding to the no lift-off and lift-off conditions of the test part; and a reference eddy current coil facing a reference sample to generate reference signals corresponding to the no lift-off and lift-off conditions of the reference sample.

11. The eddy current system of claim 10, wherein the processor is configured to compare the test and reference signals at the no lift-off and lift-off conditions to generate the first and second signals.

12. The eddy current system of claim 10, further comprising a signal generator configured to energize the test and reference eddy current coils at a plurality of frequencies.

13. An eddy current system for inspecting a test part, comprising:

an eddy current probe configured to scan the test part and generate first and second signals corresponding to no lift off and lift-off conditions of the test part; and a processor configured to process the first and second signals to estimate an electrical conductivity of the test part, wherein the processor is further configured to:

generate a lift-off curve using the first and second signals corresponding to the no lift-off and lift-off conditions of the test part;

estimate a lift-off angle from the lift-off curve wherein the lift-off angle ($\theta$) is represented by $$\theta = \frac{180}{\pi} \tan^{-1}\left[\frac{X_1 - X_0}{R_1 - R_0}\right]$$

where $X_1$ is the reactive component of the test part corresponding to a lift-off of l;

$X_0$ is the reactive component of the test part corresponding to a no lift-off condition;

$R_1$ is the resistive component of the test part having a lift-off of l; and $R_0$ is the resistive component of the test part corresponding to the no lift-off condition; and estimating the electrical conductivity of the test part, wherein the electrical conductivity is represented by $\sigma = m\theta + c$ where m and c are determined using two reference standards.

14. The eddy current system of claim 10, wherein the test part comprises a shotpeened part and the lift-off condition corresponds to a lift-off introduced by surface roughness of the shotpeened part such that the estimated electrical conductivity of the shotpeened part is independent of the surface roughness of the shotpeened part.

15. The eddy current system of claim 10, wherein the processor is further configured to calibrate the eddy current probe using a plurality of measurements on the test part and on a reference part having a known electrical conductivity.

16. An eddy current system for inspecting a test part, comprising:

an eddy current probe configured to scan the test part and generate first and second signals corresponding to no lift off and lift-off conditions of the test part; and a processor configured to process the first and second signals to estimate an electrical conductivity of the test part, wherein the processor is further configured to calibrate the eddy current probe using a plurality of measurements on the test part and on a reference part having a known electrical conductivity, wherein the measurements on the test part are obtained at first and second frequencies, and wherein the electrical conductivity of the test part is estimated based upon measured signals from the eddy current probe due to the test part at the first and second frequencies.

17. An eddy current system for inspecting a test part, comprising:

an eddy current probe configured to scan the test part and generate first and second signals corresponding to no lift off and lift-off conditions of the test part; and a processor configured to process the first and second signals to estimate an electrical conductivity of the test part, wherein the eddy current probe is configured to scan the part at a plurality of frequencies to obtain the first and second signals corresponding to the no lift-off and lift-off conditions of the part at each of the plurality of frequencies for obtaining a conductivity depth profile of the test part.

18. The eddy current system of claim 17, wherein the processor is further configured to generate a residual stress profile from the conductive depth profile.

19. The eddy current system of claim 18, wherein the processor is further configured to generate the residual stress profile by relating the conductive depth profile for the test part to a plurality of residual stress profile data obtained by x-ray diffraction testing.

20. A method of estimating a material property of a shot-peened test part, the method comprising:
scanning the test part using an eddy current probe for a no lift-off condition to generate a first signal;
introducing a lift-off condition for the test part;
scanning the test part using the eddy current probe for the lift-off condition to generate a second signal; and
processing the first and second signals to estimate the material property of the test part;
scanning the part using the eddy current probe at a plurality of frequencies to obtain first and second signals corresponding to the no lift-off and lift-off conditions of the part at each of the plurality of frequencies; and
obtaining a conductivity depth profile using the first and second signals obtained at the plurality of frequencies.

21. The method of claim 20, wherein the material property comprises an electrical conductivity of the test part, or a residual stress of the test part, or combinations thereof.

22. The method of claim 20, wherein the introducing step comprises positioning the eddy current probe at a pre-determined distance from the surface of the test part.

23. A method of estimating a material property of a shot-peened test part, the method comprising:
scanning the test part using an eddy current probe for a no lift-off condition to generate a first signal;
introducing a lift-off condition for the test part;
scanning the test part using the eddy current probe for the lift-off condition to generate a second signal; and
processing the first and second signals to estimate the material property of the test part, wherein the processing step comprises:
generating a lift-off curve using the first and second signals corresponding to the no lift-off and lift-off conditions of the part; and
estimating a lift-off angle from the first and second signals corresponding to the no lift-off and lift-off conditions of the test part wherein the lift-off angle ($\theta$) is represented by $$\theta = \frac{180}{\pi}\tan^{-1}\left[\frac{X_1 - X_0}{R_1 - R_0}\right]$$

where
$X_1$ is the reactive component of the test part corresponding to a lift-off of l;
$X_0$ is the reactive component of the test part corresponding to a no lift-off condition;
$R_1$ is the resistive component of the test part having a lift-off of l; and
$R_0$ is the resistive component of the test part corresponding to the no lift-off condition; and
estimating the electrical conductivity of the test part, wherein the electrical conductivity is represented by
$\sigma = m\theta \pm c$
where m and c are determined using two reference standards.

24. The method of claim 20, further comprising generating a residual stress profile from the conductive depth profile.

* * * * *

UNITED STATES PATENT AND TRADEMARK OFFICE
CERTIFICATE OF CORRECTION

PATENT NO. : 7,830,140 B2
APPLICATION NO. : 11/834759
DATED : November 9, 2010
INVENTOR(S) : Tralshawala et al.

It is certified that error appears in the above-identified patent and that said Letters Patent is hereby corrected as shown below:

In Column 8, Line 38, in Claim 3, delete "of/;" and insert -- of 1; --, therefor.

In Column 8, Line 43, in Claim 3, delete "of/; and" and insert -- of 1; and --, therefor.

In Column 11, Line 15, in Claim 20, after "signal;" delete "and".

In Column 12, Line 29, in Claim 23, delete "$\sigma = m\theta \pm c$" and insert -- $\sigma = m\theta + c$ --, therefor.

Signed and Sealed this
Fifth Day of July, 2011

David J. Kappos
*Director of the United States Patent and Trademark Office*